US012652788B2

(12) United States Patent
Wang

(10) Patent No.: US 12,652,788 B2
(45) Date of Patent: Jun. 9, 2026

(54) DYNAMIC RANDOM ACCESS MEMORY AND METHOD FOR FORMING THE SAME

(71) Applicant: Winbond Electronics Corp., Taichung City (TW)

(72) Inventor: Shou-Te Wang, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 372 days.

(21) Appl. No.: 18/473,601

(22) Filed: Sep. 25, 2023

(65) Prior Publication Data

US 2024/0121936 A1     Apr. 11, 2024

(30) Foreign Application Priority Data

Oct. 6, 2022     (TW) ................................. 111138019

(51) Int. Cl.
H10B 12/00          (2023.01)
(52) U.S. Cl.
CPC ....... H10B 12/0335 (2023.02); H10B 12/315 (2023.02); H10B 12/34 (2023.02); H10B 12/482 (2023.02); H10B 12/485 (2023.02)
(58) Field of Classification Search
CPC ...... H10B 12/315; H10B 12/02; H10B 12/30; H10B 12/31; H10B 12/01; H10B 12/00; H10B 12/033; H10B 12/482; H10B 12/485
See application file for complete search history.

(56) References Cited

U.S. PATENT DOCUMENTS

| | | | | |
|---|---|---|---|---|
| 5,506,166 | A * | 4/1996 | Sandhu ................. | H10B 12/033 438/653 |
| 7,002,199 | B2 * | 2/2006 | Fukuzumi .............. | H10D 1/042 257/306 |
| 9,613,967 | B1 * | 4/2017 | Chien ................. | H10B 12/0335 |
| 10,714,483 | B2 * | 7/2020 | Chen .................. | H10B 12/0335 |
| 10,734,390 | B1 * | 8/2020 | Park ..................... | H10B 12/315 |
| 10,910,380 | B2 * | 2/2021 | Takesako ............. | H10B 12/315 |
| 10,923,479 | B2 * | 2/2021 | Chen .................... | H10B 12/318 |
| 10,998,230 | B2 | 5/2021 | Basker et al. | |
| 12,581,644 | B2 * | 3/2026 | Wang ..................... | H10B 12/02 |

(Continued)

FOREIGN PATENT DOCUMENTS

TW          I735860 B     8/2021

*Primary Examiner* — Sophia T Nguyen
(74) *Attorney, Agent, or Firm* — MUNCY, GEISSLER, OLDS & LOWE, P.C.

(57)          ABSTRACT
A method for forming a DRAM includes forming a bit line contact over the active area, forming a bit line over the bit line contact, and forming a hard mask layer over the bit line. The method includes forming a semiconductor material layer over the active area and forming a metal layer over the semiconductor material layer and the hard mask layer. The method includes removing the metal layer over the hard mask layer and exposing the top surface of the hard mask layer, and the remaining portion of the metal layer is between hard mask layers. The method includes removing a portion of the hard mask layer after exposing a portion of the hard mask layer. The method includes forming a capacitor contact conductive layer over the remaining portion of the metal layer after removing the portion of the hard mask layer.

14 Claims, 12 Drawing Sheets

100

(56) References Cited

U.S. PATENT DOCUMENTS

| | | | | |
|---|---|---|---|---|
| 2003/0214872 A1* | 11/2003 | Tu | H10B 12/485 | |
| | | | 257/E27.087 | |
| 2006/0138510 A1* | 6/2006 | Fazan | H10D 1/716 | |
| | | | 257/296 | |
| 2008/0064206 A1* | 3/2008 | Seo | H10B 12/482 | |
| | | | 257/E21.495 | |
| 2010/0181623 A1* | 7/2010 | Im | H10D 89/10 | |
| | | | 257/E27.06 | |
| 2011/0183512 A1* | 7/2011 | Cho | H10B 12/0335 | |
| | | | 257/E21.585 | |
| 2012/0276711 A1* | 11/2012 | Yoon | H01L 21/764 | |
| | | | 257/E21.573 | |
| 2013/0154101 A1* | 6/2013 | Park | H01L 23/528 | |
| | | | 257/773 | |
| 2015/0255465 A1* | 9/2015 | Yokomichi | H10B 12/0335 | |
| | | | 438/655 | |
| 2018/0108608 A1* | 4/2018 | Lee | H01L 21/76895 | |
| 2018/0342517 A1* | 11/2018 | Takesako | H10B 12/0335 | |
| 2019/0019795 A1* | 1/2019 | Takesako | H10B 12/315 | |
| 2019/0189620 A1* | 6/2019 | Wang | H10B 12/482 | |
| 2019/0312037 A1* | 10/2019 | Chang | H01L 21/0337 | |
| 2019/0319029 A1* | 10/2019 | Chen | H10B 12/318 | |
| 2020/0203354 A1* | 6/2020 | Lee | H10B 12/02 | |
| 2020/0312707 A1* | 10/2020 | Chen | H10B 12/30 | |
| 2020/0388618 A1* | 12/2020 | Ikeda | H01L 21/32133 | |
| 2021/0225763 A1* | 7/2021 | Tseng | H10W 20/069 | |
| 2021/0398982 A1* | 12/2021 | Li | H10B 12/482 | |
| 2021/0398983 A1* | 12/2021 | Lee | H10B 12/0335 | |
| 2022/0037251 A1* | 2/2022 | Park | H10B 12/09 | |
| 2022/0052055 A1* | 2/2022 | Chun | H10B 12/053 | |
| 2022/0068928 A1* | 3/2022 | Lu | H10B 12/03 | |
| 2022/0139921 A1* | 5/2022 | Kim | H01L 23/528 | |
| 2022/0216210 A1* | 7/2022 | Wei | H10D 62/115 | |
| 2022/0254786 A1* | 8/2022 | Lu | H10B 12/0335 | |
| 2022/0285361 A1* | 9/2022 | Yu | H10B 12/315 | |
| 2022/0320110 A1* | 10/2022 | Lu | H10B 12/482 | |
| 2022/0336465 A1* | 10/2022 | Kim | H10B 12/315 | |
| 2023/0055073 A1* | 2/2023 | Yang | H10B 12/482 | |
| 2023/0063527 A1* | 3/2023 | Lee | H10B 12/315 | |
| 2023/0209806 A1* | 6/2023 | Wu | H10B 12/0335 | |
| | | | 257/295 | |
| 2023/0225115 A1* | 7/2023 | Wu | H10B 12/0335 | |
| | | | 257/296 | |
| 2023/0232612 A1* | 7/2023 | Shin | H10B 12/0335 | |
| | | | 257/296 | |
| 2023/0253317 A1* | 8/2023 | Tung | H01L 21/32139 | |
| | | | 257/734 | |
| 2023/0328952 A1* | 10/2023 | Guo | H10B 12/033 | |
| 2024/0023307 A1* | 1/2024 | Chu | H10B 12/315 | |
| 2024/0172427 A1* | 5/2024 | Kwon | H10B 12/09 | |
| 2025/0365939 A1* | 11/2025 | Lee | H01L 23/5283 | |

* cited by examiner

100

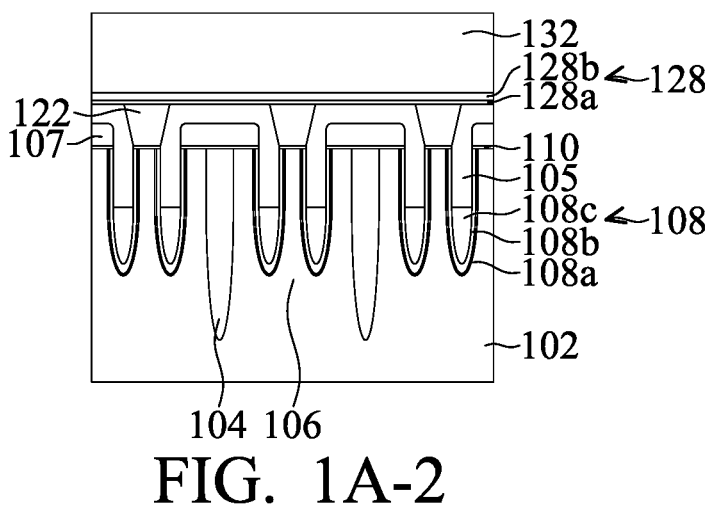
FIG. 1A-2
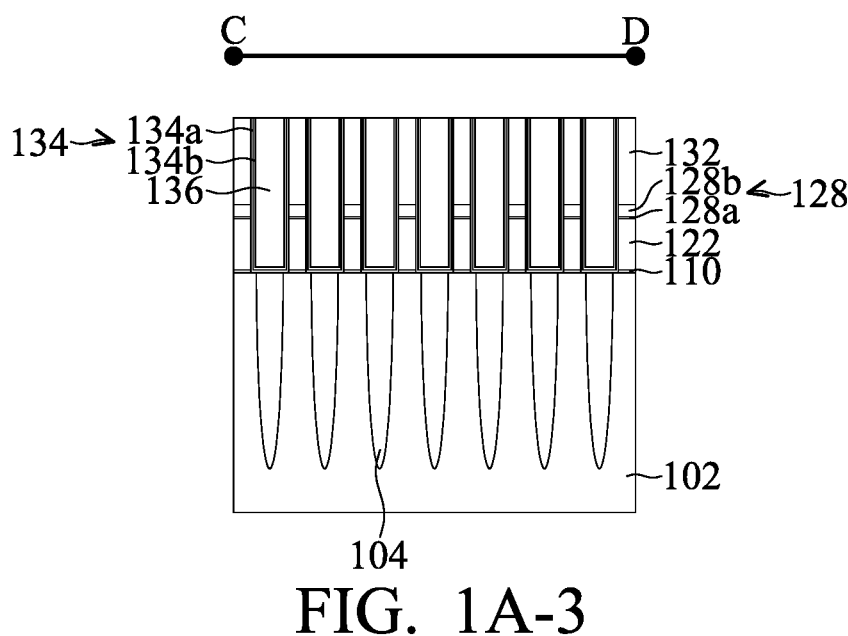
FIG. 1A-3

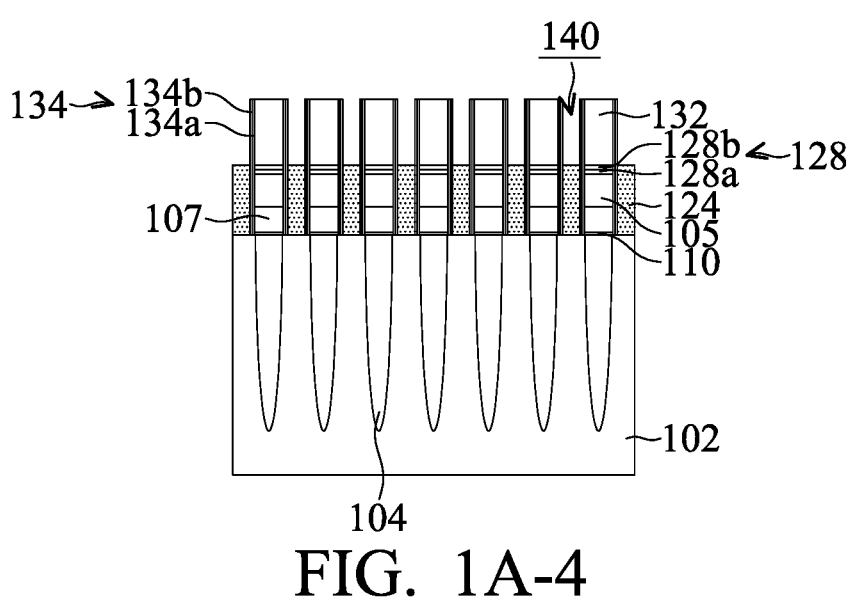
FIG. 1A-4
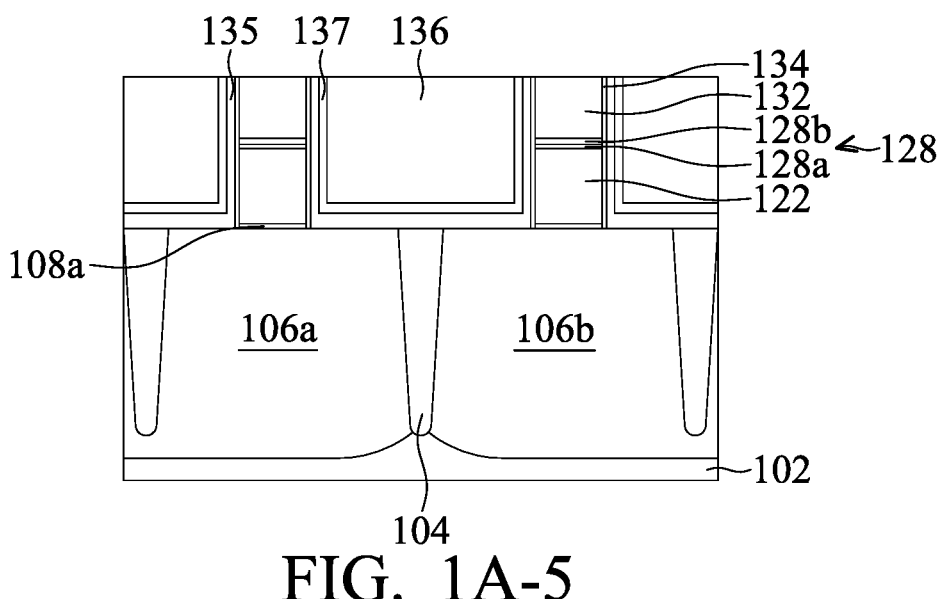
FIG. 1A-5

100
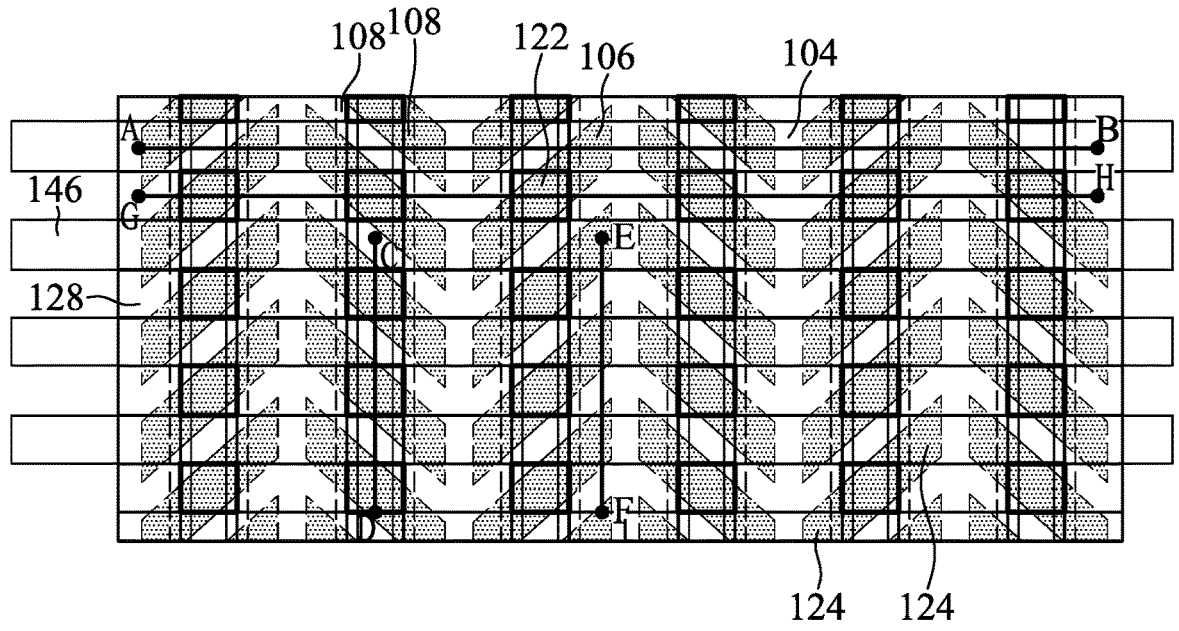
FIG. 1B
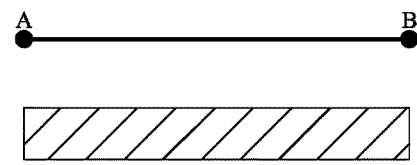
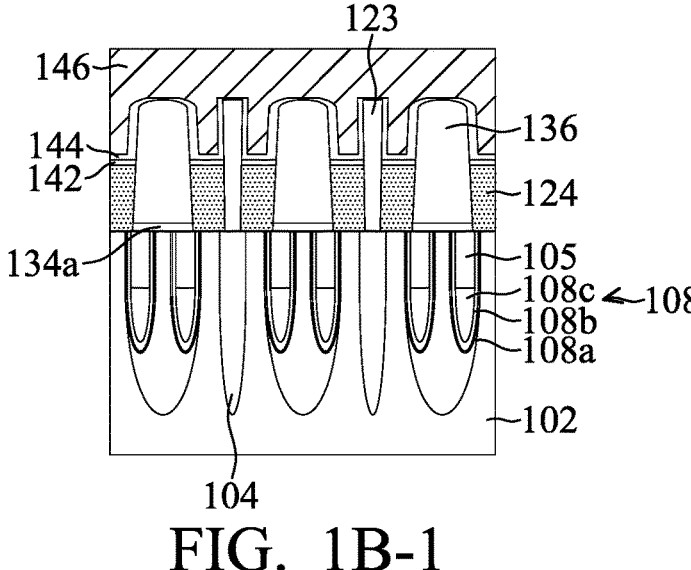
FIG. 1B-1

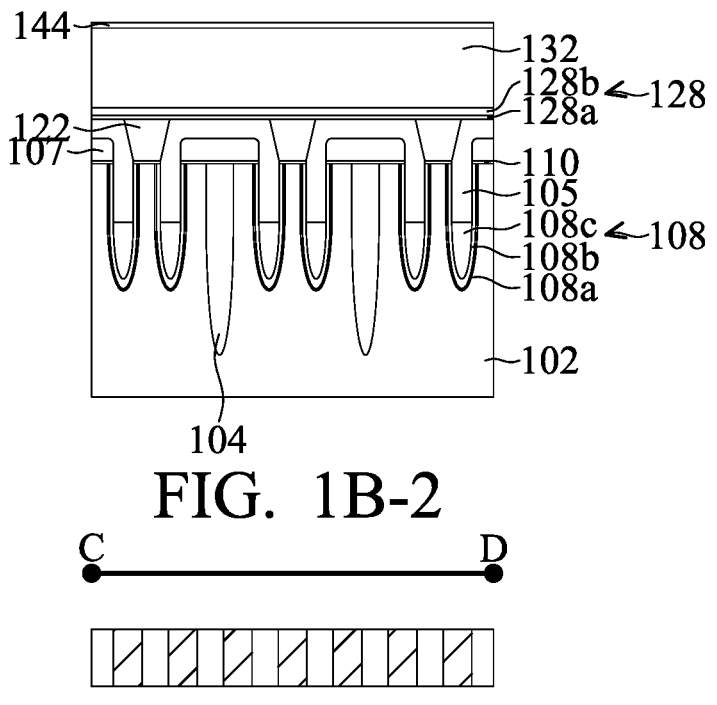
FIG. 1B-2
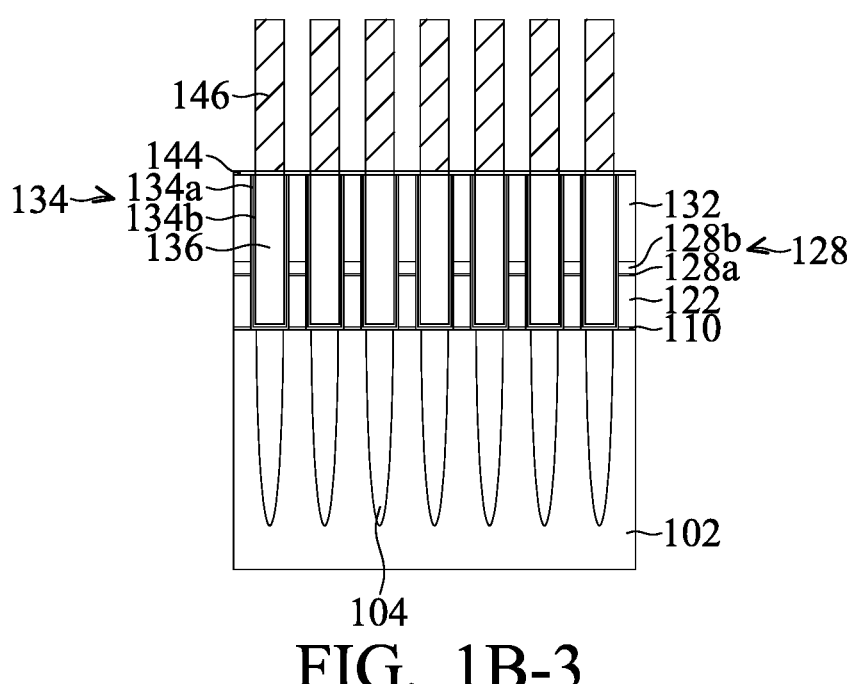
FIG. 1B-3

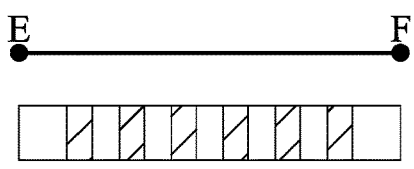
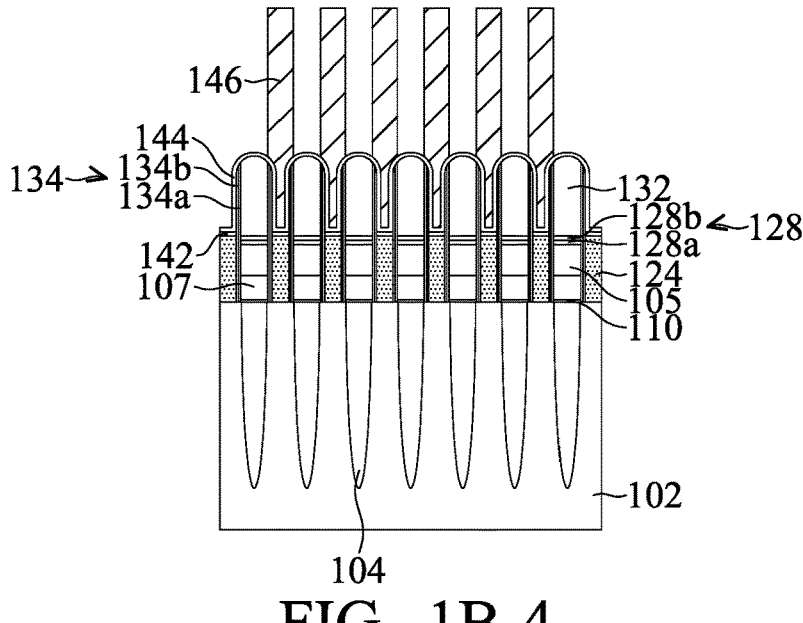
FIG. 1B-4
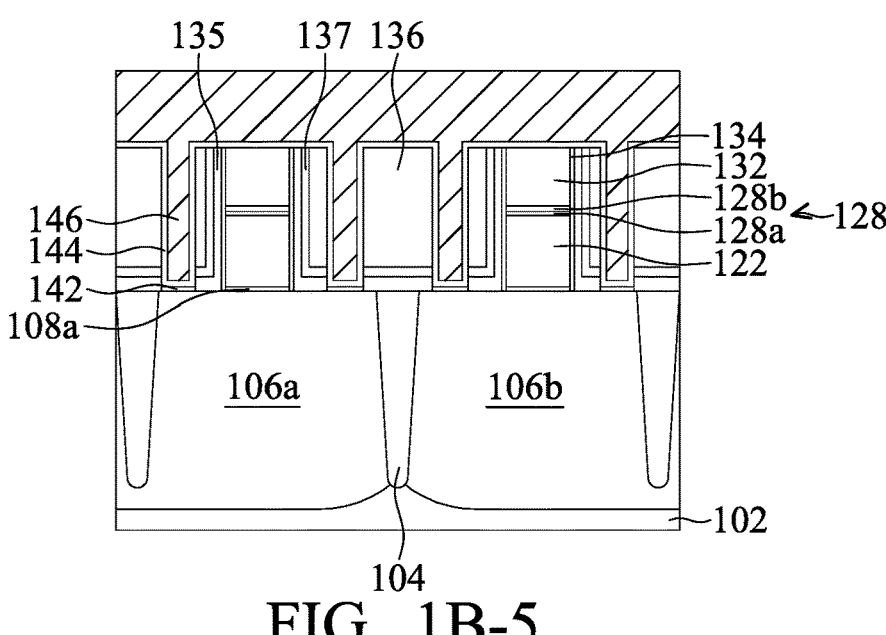
FIG. 1B-5

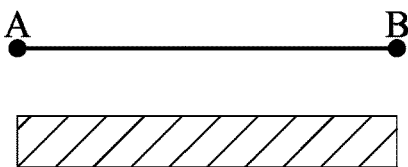
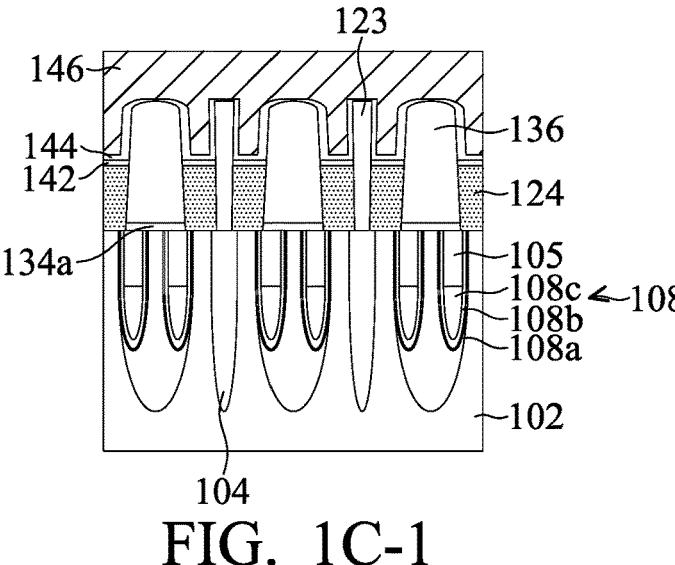
FIG. 1C-1
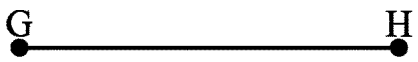
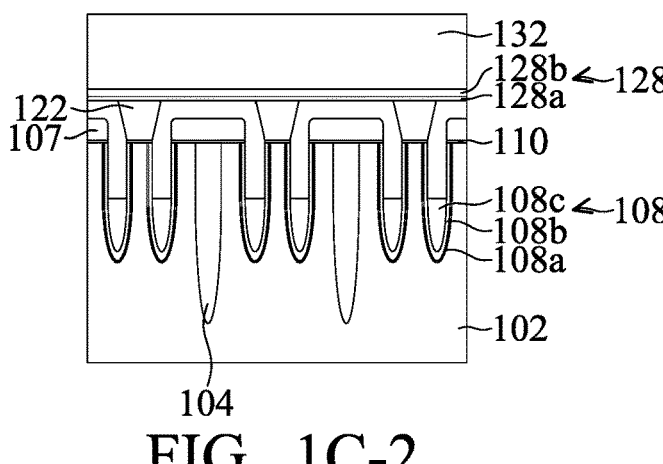
FIG. 1C-2

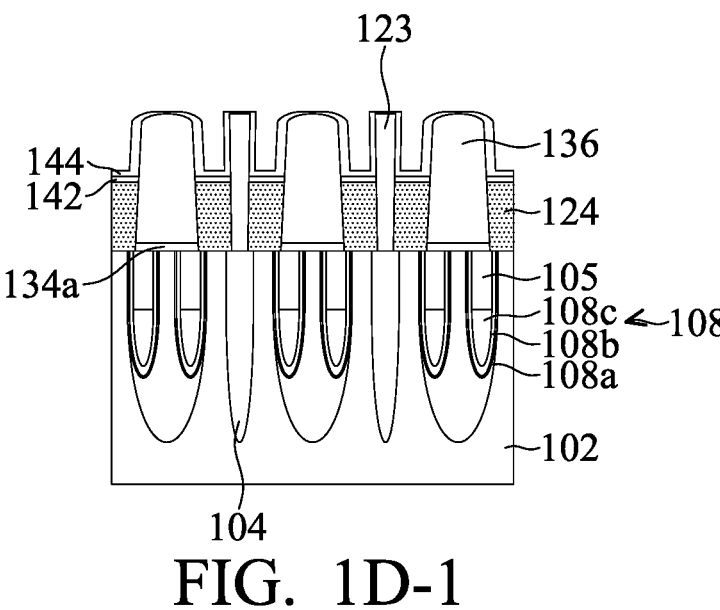
FIG. 1D-1
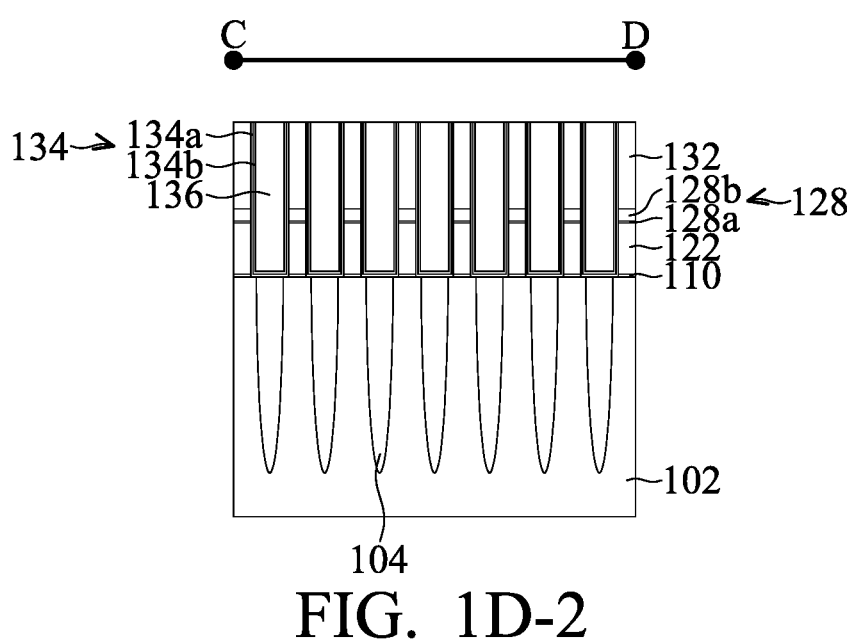
FIG. 1D-2

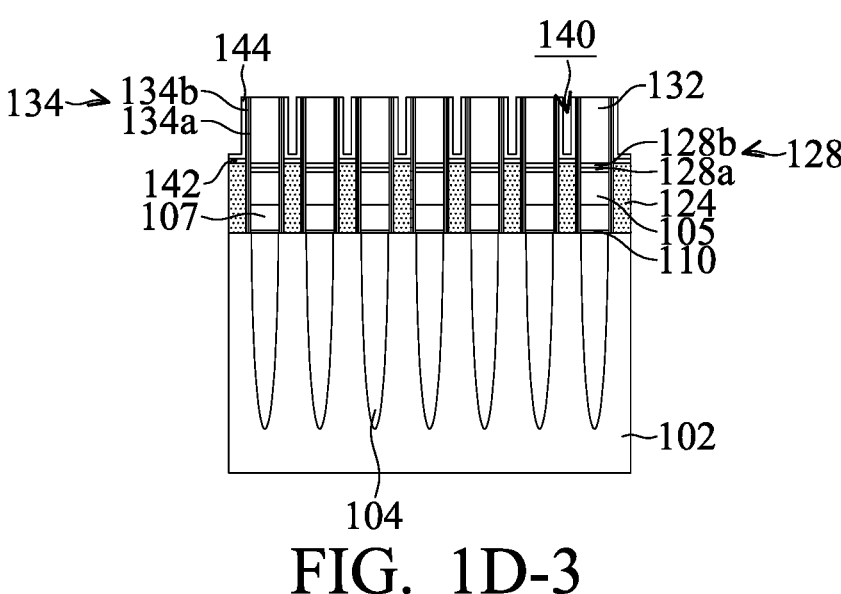
FIG. 1D-3
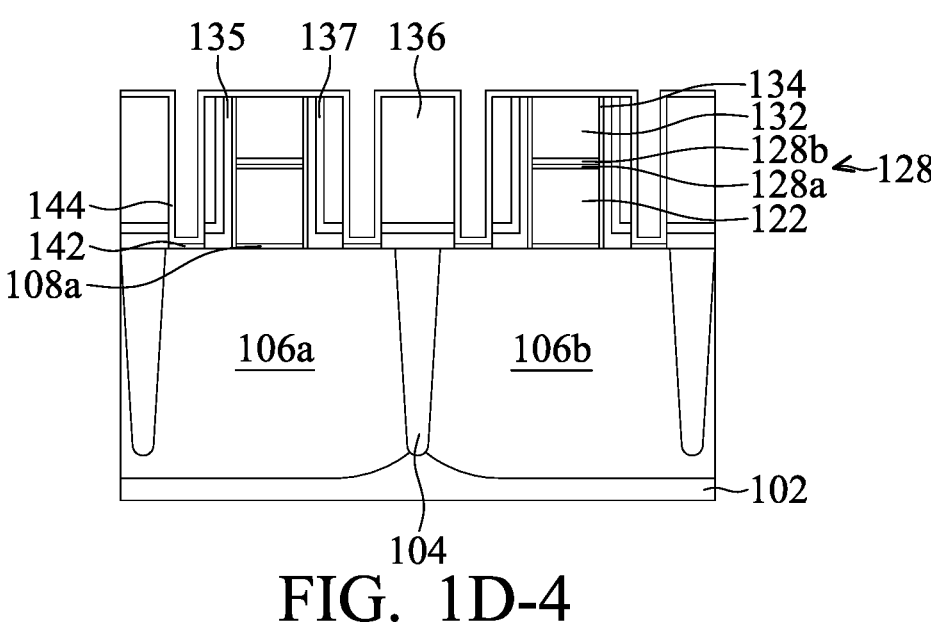
FIG. 1D-4

100
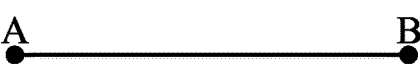
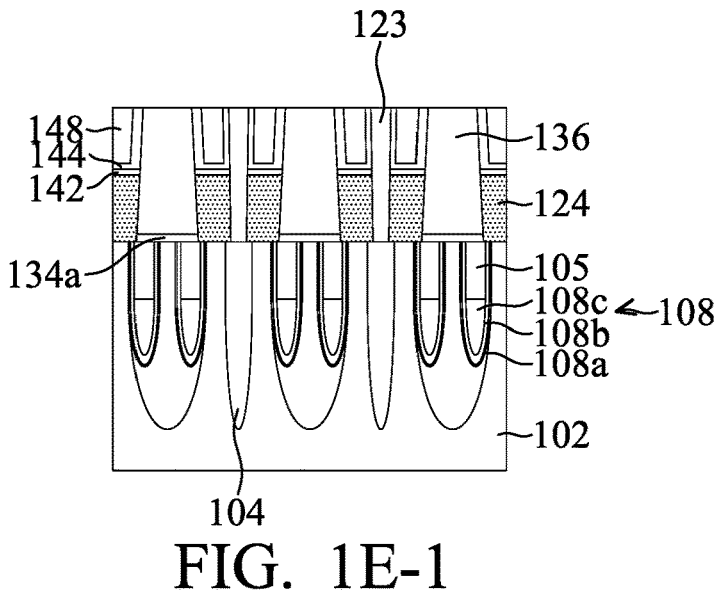
FIG. 1E-1
100
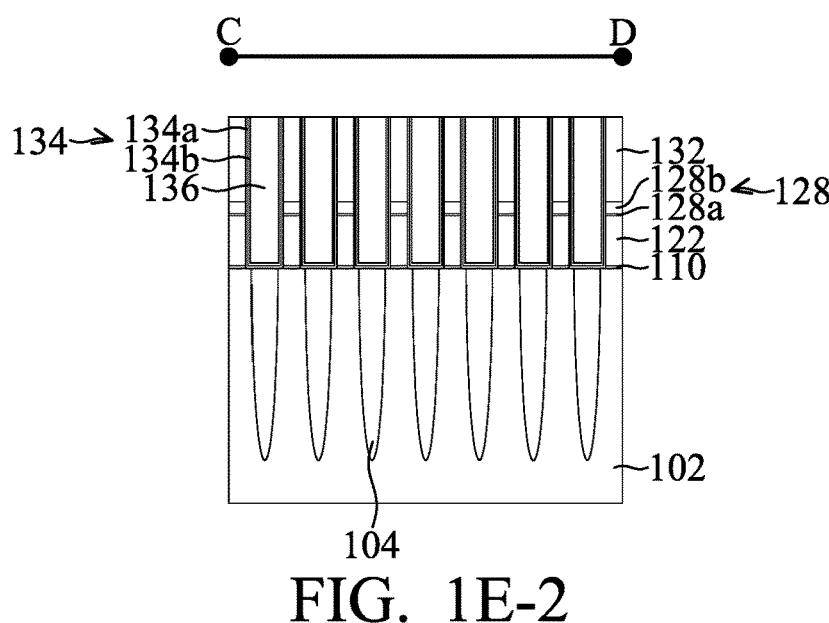
FIG. 1E-2

100
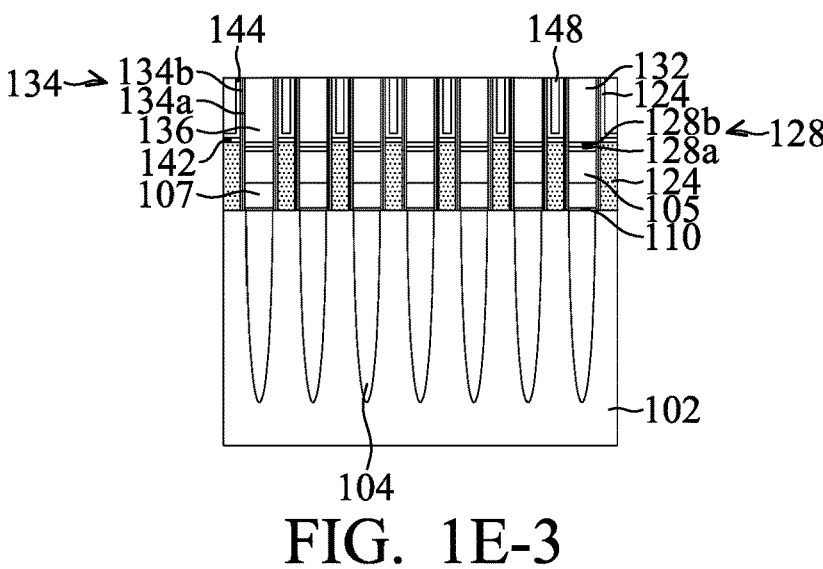
FIG. 1E-3
100
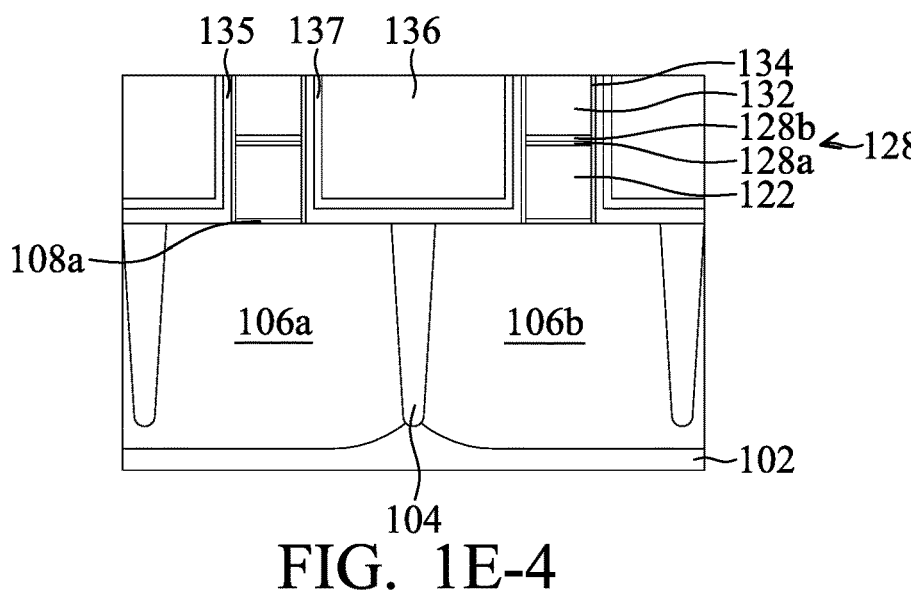
FIG. 1E-4

DYNAMIC RANDOM ACCESS MEMORY AND METHOD FOR FORMING THE SAME

CROSS REFERENCE TO RELATED APPLICATIONS

This application claims the benefit of Taiwan Patent Application No. 111138019 filed on Oct. 6, 2022, entitled "DYNAMIC RANDOM ACCESS MEMORY AND METHOD FOR FORMING THE SAME" which is hereby incorporated herein by reference.

BACKGROUND OF THE INVENTION

Field of the Invention

The present invention relates to a semiconductor memory device, and, in particular, to a capacitor contact of a dynamic random access memory (DRAM) and method for forming the same.

Description of the Related Art

As the size of integrated circuits decreases, in the DRAM formation process, the top surface of the hard mask layer over the bit line may be not flat. As a result, the planarization process for the subsequently formed capacitor contact may not separate the two adjacent capacitor contacts. This may cause a short circuit between capacitor contacts.

BRIEF SUMMARY OF THE INVENTION

This invention proposes a dynamic random access memory and its forming method, which can reduce the probability of short-circuiting between capacitor contacts.

An embodiment of the present invention provides a method for forming a DRAM that includes forming an isolation structure surrounding an active area in a substrate. The method also includes forming a bit line contact over the active area. The method also includes forming a bit line over the bit line contact. The method also includes forming a hard mask layer over the bit line. The method also includes forming a semiconductor material layer over the active area. The method also includes forming a metal layer over the semiconductor material layer and the hard mask layer. The method also includes removing the metal layer over the hard mask layer and exposing the top surface of the hard mask layer, and the remaining portion of the metal layer is between adjacent hard mask layers. The method also includes removing a portion of the hard mask layer after exposing a portion of the hard mask layer. The method also includes forming a capacitor contact conductive layer over the remaining portion of the metal layer after removing the portion of the hard mask layer.

An embodiment of the present invention provides a DRAM includes an isolation structure surrounding an active area. The isolation structure is in a substrate. The DRAM also includes a plurality of bit line contacts disposed over the active area. The DRAM also includes a plurality of bit lines, and each of the bit lines is disposed over one of the bit line contacts. The DRAM also includes a plurality of hard mask layers disposed over the respective bit lines. The DRAM also includes a semiconductor material layer disposed over the active area. The DRAM also includes a metal layer disposed over the semiconductor material layer between the adjacent hard mask layers; and a capacitor contact disposed over the metal layer. The top surface of each of the hard mask layers is level with the top surface of the capacitor contact. A top surface of the metal layer forms a recess to cover a sidewall of the hard mask layer, and the top surface of the metal layer is level with the top surface of the capacitor contact.

According to the DRAM and method for forming the same provided by the present disclosure, by forming a photoresist pattern over the metal layer as an etching mask to remove a portion of the hard mask layer, the hard mask layer over the bit line has a flat top surface, and the aspect ratio of the capacitor contact is reduced. In this way, the uniformity of the capacitor contact resistance is favored, and the yield may be improved, and the adjacent capacitor contacts are less likely to be short-circuited.

BRIEF DESCRIPTION OF THE DRAWINGS

The present invention can be more fully understood by reading the subsequent detailed description and examples with references made to the accompanying drawings, wherein:

FIGS. 1A and 1B are top views of array region for illustrating various stages of forming a DRAM in accordance with some embodiments.

FIGS. 1A-1, 1A-2, 1A-3, 1A-4, 1A-5, 1B-1, 1B-2, 1B-3, 1B-4, 1B-5, 1C-1, 1C-2, 1C-3, 1C-4, 1D-1, 1D-2, 1D-3, 1D-4, 1E-1, 1E-2, 1E-3, 1E-4 are cross-sectional representations of various stages of forming a DRAM in accordance with some embodiments.

DETAILED DESCRIPTION OF THE INVENTION

Figure 1A:
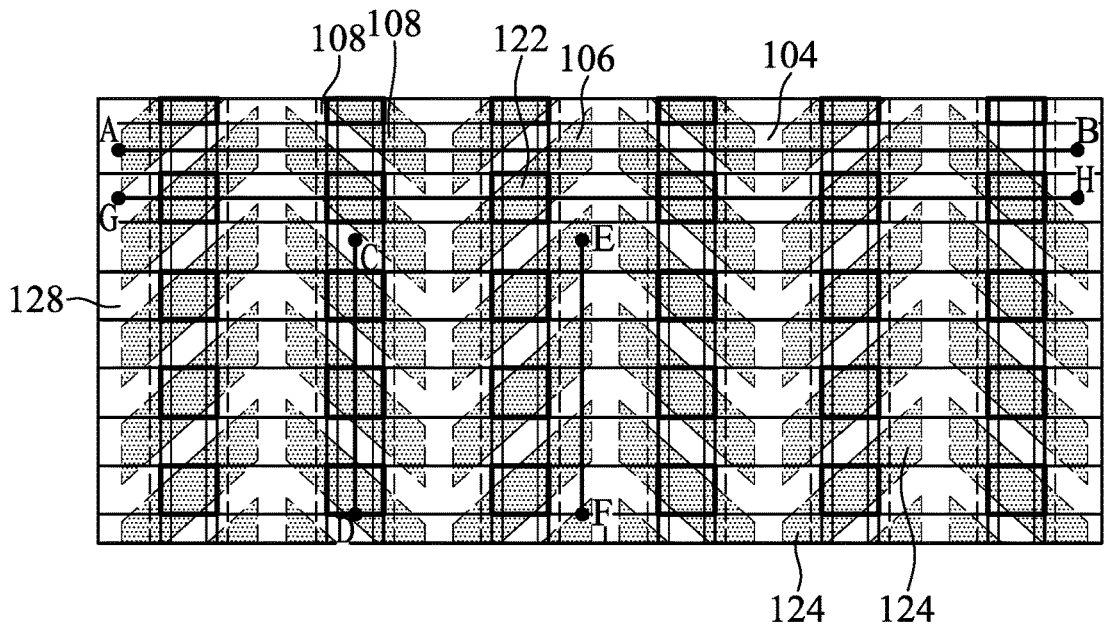

FIGS. 1A and 1B are top views of array region of a DRAM 100 in various forming stages in accordance with some embodiments. FIGS. 1A-1, 1B-1, 1C-1, 1D-1, 1E-1 show cross-sectional representations of DRAM 100 taken along line A-B in FIGS. 1A, 1B. FIGS. 1A-2, 1B-2, 1C-2 show cross-sectional representations of DRAM 100 taken along line G-H in FIGS. 1A, 1B. FIGS. 1A-3, 1B-3, 1C-3, 1D-2, 1E-2 show cross-sectional representations of DRAM 100 taken along line C-D in FIGS. 1A, 1B. FIGS. 1A-4, 1B-4, 1C-4, 1D-3, 1E-3 show cross-sectional representations of DRAM 100 taken along line E-F in FIGS. 1A, 1B. FIGS. 1A-5, 1B-5, 1D-4, 1E-4 show cross-sectional representations of periphery region of DRAM 100. There is no process change in other un-shown cross-sectional representations.

As shown in FIGS. 1A and 1A-1, 1A-2, 1A-3, 1A-4, 1A-5, the substrate 102 of the DRAM 100 includes isolation structure 104 surrounding the active area 106. The DRAM 100 includes the bit line contact 122 formed between two word lines 108, which is used to electrically connect the bit line 128 formed above to the active area 106. In the present disclosure, the bit line material is patterned to form the bit line 128, and the bit line 128 extends in the direction perpendicular to the extension direction of the word line 108 in the top view.

In detail, the substrate 102 may be a semiconductor substrate, which may include elemental semiconductor or alloy semiconductor. In addition, the substrate 102 may also be a semiconductor on insulator (SOI). The substrate 102 may be an N-type or a P-type conductivity type. The isolation structure 104 may be formed by silicon oxide, silicon nitride, other dielectric material, or a combination thereof. The isolation structure 104 may be formed by a chemical vapor deposition (CVD) process such as a flowable CVD (FCVD) process.

As shown in FIGS. 1A-2 and 1A-3, a buffer layer 110 is formed over the substrate 102. In some embodiments, the buffer layer 110 is oxides such as silicon oxide. The buffer layer 110 may be formed by a deposition process, a spin-on coating process, a sputtering process, or a combination thereof. In some embodiments, the isolation structure 104 and the buffer layer 110 are formed by the same material.

Different conductive types of active areas 106 are formed in the substrate 102 of the periphery regions by an implanting process. For example, as shown in FIG. 1A-5, the active area 106a may be a p-type active area, and the active area 106b may be an n-type active area. The implanting process may include implanting a p-type dopant or an n-type dopant. The p-type dopant may include boron, gallium, aluminum, indium, $BF3^+$, or a combination thereof. The n-type dopant may include phosphorus, arsenic, nitrogen, antimony ions, or a combination thereof.

Next, the isolation structure 104 and a portion of the buffer layer 110 and the active area 106 is covered by a mask layer 107, and a patterning process such as a photolithography and an etching process is performed to form two word line trenches (i.e. where word line 108 will be formed) in each active area 106. The mask layer 107 may include tetraethoxysilane (TEOS). Next, a word line 108 is formed in the word line trench in the active area 106. The mask layer 107 may be used to define the position of the word line 108. The word lines 108 include the gate dielectric layer 108a, the barrier layer 108b, and the conductive layer 108c. The gate dielectric layer 108a is formed over the sidewalls and the bottom surface of the word line trench in the active area 106. The barrier layer 108b may be formed over the gate dielectric layer 108a over the sidewalls and the bottom surface of the word line trench in the active area 106 to prevent diffusion of subsequently formed conductive material. Afterwards, the word line trench in the active area 106 is filled by the conductive layer 108c.

In some embodiments, the gate dielectric layer 108a may include silicon oxide, silicon nitride, or silicon oxynitride, dielectric material with high dielectric constant (high-k) (i.e. dielectric constant greater than 3.9) such as $HfO_2$, $La_xO_y$, $Al_xO_y$, $Zr_xO_y$, $Ti_xO_y$, $Ta_2O_5$, $Y_2O_3$, $SrTiO_3$, $BaTiO_3$, $BaZr_xO_y$, $HfZr_xO_y$, $HfLa_xO_y$, $HfTa_xO_y$, $HfSi_xO_y$, $HfSi_xO_yN$, $HfTi_xO_y$, $LaSi_xO_y$, $AlSi_xO_y$, or a combination thereof. In some embodiments, the gate dielectric layer 108a is formed by a thermal oxide process such as rapid thermal processing (RTP) in-situ steam generation (ISSG) in the word line trench in the active area 106.

Different devices may be formed in different active areas, and the thickness of the gate dielectric layers 108a may be different. For example, as shown in FIG. 1A-5, when different devices are formed in active areas 106a and 106b, the thicknesses of the gate dielectric layers 108a may be different.

In some embodiments, the barrier layer 108b is made of metal material. The material of the barrier layer 108b may be Ti, TiN, Ta, TaN, W, WN, or a combination thereof. The conductive layer 108c includes metal material (such as tungsten, aluminum, or copper), metal alloy, or a combination thereof.

Next, an etching process is performed to etch back the conductive layer 108c in the active area 106 to a desired height to form the word line 108, and a recess (i.e. where a capping layer 105 will be formed) over the word line 108.

Figures 1, 1A:
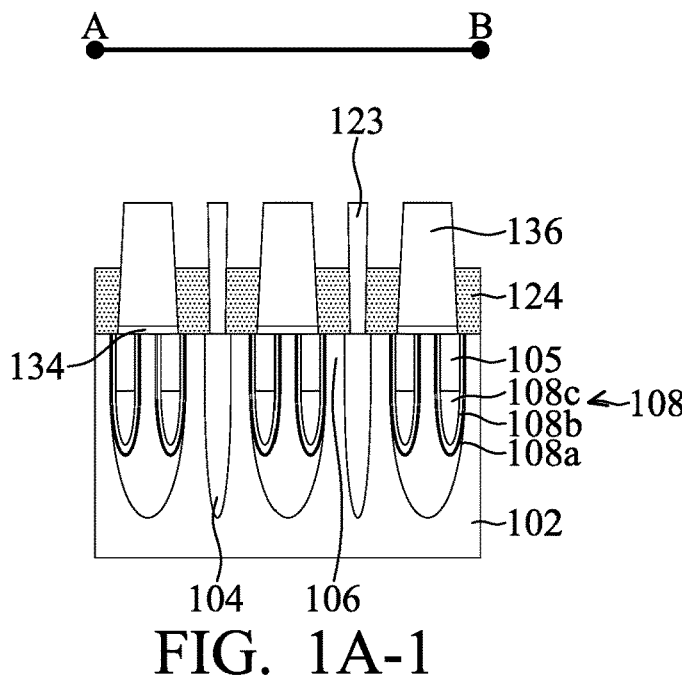
Figures 1, 1C, 2, 3:
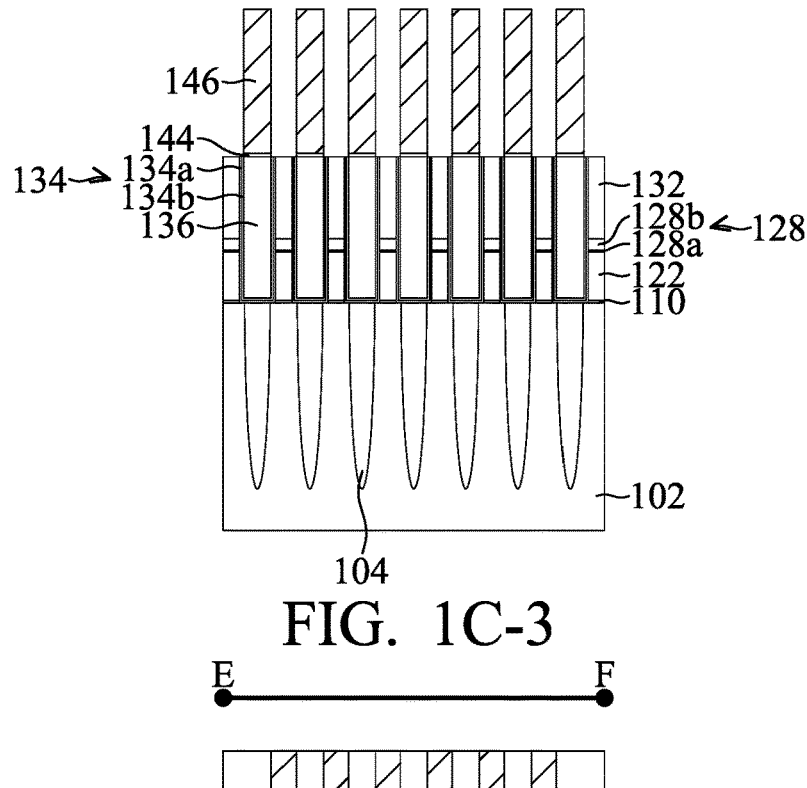
Figures 1, 1C, 2, 3, 4:
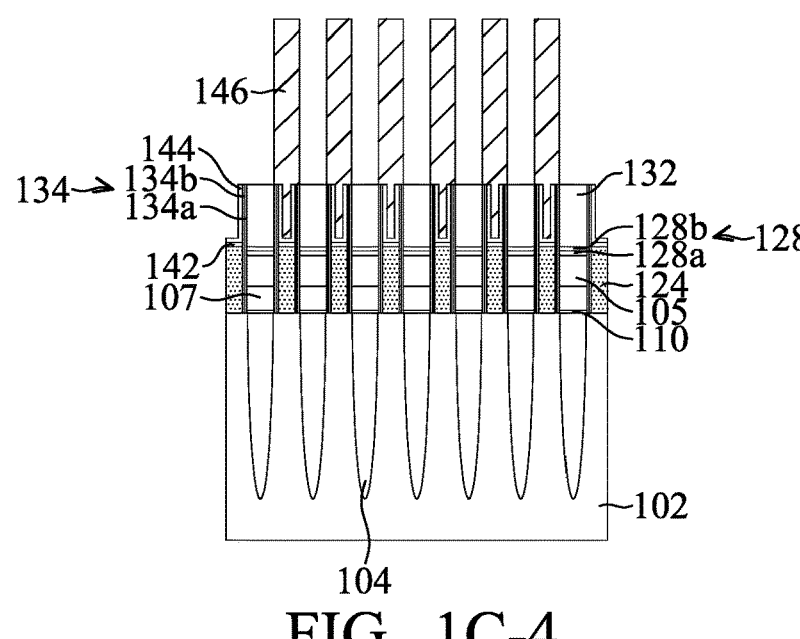

Afterwards, as shown in FIG. 1A-2, the recess over the word line 108 is filled by a capping layer 105, and the capping layer 105 is extended covering the sidewalls and the top surface of the mask layer 107. In some embodiments, the capping layer 105 includes nitrides such as SiN, SiCN, SiOC, SiOCN. In some embodiments, after forming the capping layer 105, a recess is formed above the active area 106 between two word lines 108 (i.e. where bit line contact 122 will be formed).

Afterwards, as shown in FIG. 1A-2, a semiconductor material is deposited in the recess above the active area 106 between two word lines 108 to form a bit line contact 122. The semiconductor material layer may include polysilicon.

Next, as shown in FIG. 1A-2, the bit line 128 is formed over the bit line contact 122 and the capping layer 105. The bit line 128 includes the barrier layer 128a and the conductive layer 128b. The material of the barrier layer 128a may be Ti, TiN, Ta, TaN, WN, other applicable material, or a combination thereof. The conductive layer 128b includes metal material (such as tungsten, aluminum, or copper), metal alloy, or a combination thereof. The barrier layer 128a and the conductive layer 128b of the bit line 128 may be formed by the atomic layer deposition (ALD) process.

Next, a hard mask layer 132 is formed over the bit line 128. The hard mask layer 132 may include nitrides such as SiN, SiCN, SiOC, SiOCN. The hard mask layer 132 may be a multi-layer structure.

Next, as shown in FIGS. 1A-1, 1A-3, 1A-4, a trench (i.e. where the liner layer 134 will be formed) is formed between the bit lines 128. Next, the liner layer 134 is conformally formed over the surface of the trench between the bit lines 128. As shown in FIG. 1A-3, the liner layer 134 is formed over the sidewalls of the bit line 128, the hard mask layer 132, and the bit line contact 122. As shown in FIG. 1A-4, the liner layer 134 may be also formed over the sidewalls of the capping layer 105 and the mask layer 107.

The liner layer 134 may be a multi-layer structure. The liner layer 134 may include the first liner layer 134a and the second liner layer 134b formed over the first liner layer 134a. The liner layer 134 may include oxides, nitrides, other applicable dielectric materials, or a combination thereof. The first liner layer 134a and the second liner layer 134b may be made of different materials. In some embodiments, the first liner layer 134a includes silicon nitride, the second liner layer 134b may include silicon oxide. In some embodiments, the first liner layer 134a is thicker than the second liner layer 134b.

Next, as shown in FIG. 1A-5, a spacer layer 135 is conformally formed over the surface of the trench between the bit lines 128 of the periphery region. In this embodiment, the spacer layer 135 is conformally formed on the liner layer 134 in the periphery region. The spacer layer 135 may include oxides. An adhesion layer 137 is conformally formed over the spacer layer 135. The adhesion layer 137 may improve the adhesion between the spacer layer 135 and the subsequently formed blocking structure material. The adhesion layer 137 may include nitrides.

Next, as shown in FIGS. 1A-1, 1A-3, 1A-5, the blocking structure material for forming a plurality of blocking structures 136 is filled in the trench between the bit lines 128. In this embodiment, the blocking structures 136 are formed on the liner layer 134 in the array region, and formed on the adhesion layer 137 in the periphery region. The blocking structure material may include spin-on glass oxide materials. The blocking structure material is patterned to form the blocking structures 136. In this embodiment, as shown in FIG. 1A-1, each blocking structure 136 in the array region is formed over two word lines 108, and the liner layer 134 between the blocking structures 136 is removed to expose the active area 106. A semiconductor material layer 124 is then filled between the blocking structures 136. The semiconductor material layer 124 may include polysilicon material. Afterwards, a separation trench is formed in the semiconductor material layer 124 by a patterning process such as a photolithography and an etching process (not shown). Afterwards, as shown in FIG. 1A-1, a separation material 123 is filled in the separation trench. The separation material 123 may include nitrides such as silicon nitrides.

Afterwards, as shown in FIGS. 1A-1 and 1A-4, an etching back process is performed to etch the semiconductor material layer 124 between the separation material 123 and the blocking structure 136, to reduce the height of the semiconductor material layer 124 in order to form a contact recess 140 beside the bit line 128. In some embodiments, the height of the top surface of the semiconductor material layer 124 is as high as the height of the bit line 128. In some embodiments, after the etching back process, the top surface of the hard mask layer 132 is in an arc shape (not shown).

Next, as shown in FIG. 1B-5, periphery contact holes (i.e., where silicide 142 will be formed) are formed in the blocking structure material over the active areas 106a and 106b on opposite sides of the bit line 128 in the periphery region. Each periphery contact hole exposes the top surface of the active area 106a or 106b.

Next, as shown in FIGS. 1B-1, 1B-4, 1B-5, a silicide 142 may be formed on the semiconductor material layer 124 and the active areas 106a and 106b of the periphery region exposed by the periphery contact hole. The silicide 142 may decrease the contact resistance. Forming the silicide 142 may include forming a metal layer such as a Titanium (Ti) layer over the semiconductor material layer 124 and the active areas 106a and 106b of the periphery region first, and then an annealing process is performed to form silicide (such as TiSi 2), and the unreacted metal layer may be removed in an etching process.

Next, a metal layer 144 is conformally formed in the contact recess 140 and the periphery contact hole. The metal layer 144 may include cobalt (Co). As shown in FIG. 1B-4, the metal layer 144 is formed over the silicide 142 over the top surface of the semiconductor material layer 124, the surface of the liner layer 134, and the surface of the hard mask layer 132.

Next, as shown in FIG. 1B-5, an implantation process is performed in the active areas 106a and 106b exposed by the periphery contact holes, in order to form source or drain region. The implant process may include implanting p-type dopant and n-type dopant.

Next, as shown in FIGS. 1B, 1B-1, 1B-3, 1B-4, 1B-5, a photoresist pattern 146 is formed over the metal layer 144, in which the photoresist pattern 146 exposes the top surface of the metal layer 144 over the hard mask layer 132. In other words, the opening of the photoresist pattern 146 corresponds to the position of the bit line 128.

Next, as shown in FIGS. 1C-1, 1C-2, 1C-3, 1C-4, an etching process is performed using the photoresist pattern 146 as a mask, to remove the metal layer 144 over the hard mask layer 132, and to expose the top surface of the hard mask layer 132, to make sure that the remaining metal layer 144 in the contact recess 140 is formed between adjacent hard mask layers 132 and has a surface that forms a recess (as shown in FIG. 1C-4). After exposing the top surface of the hard mask layer 132, the portion of the hard mask layer 132 is removed, to make sure that the hard mask layer 132 has a flat top surface. In some embodiments, the etching process is performed by a dry etching process such as a plasma etching process. In some embodiments, the remaining portion of the hard mask layer 132 has a thickness of 80-95% of the thickness of the hard mask layer 132 before etching, but the present disclosure is not limited thereto.

Next, as shown in FIGS. 1D-1, 1D-2, 1D-3, 1D-4, after etching the hard mask layer 132, the photoresist pattern 146 is removed and a cleaning process is performed. As shown in FIG. 1D-3, after removing the photoresist pattern 146, the remaining metal layer 144 in the contact recess 140 between the hard mask layers 132 is exposed. Removing the photoresist pattern 146 includes an ashing process, and the organic residue is removed by the cleaning process.

Afterwards, as shown in FIGS. 1E-1, 1E-2, 1E-2, 1E-3, 1E-4, a capacitor contact conductive layer is filled in the contact recess 140. The capacitor contact conductive layer may include metal such as tungsten. In some embodiments, the material of the metal layer 144 and the material of the capacitor contact conductive layer are different. Next, the capacitor contact conductive layer is planarized to form the capacitor contact 148, and the top surfaces of the hard mask layer 132 and the blocking structures 136 are exposed, and the top surface of the capacitor contact 148 is level with the top surface of the remaining portion of the hard mask layer 132. In some embodiments, the capacitor contact 148 is formed over the metal layer 144, and the top surface of the capacitor contact 148 is level with the top surface of the remaining portion of the metal layer 144. In some embodiments, the widths of the top surface and the bottom surface of the capacitor contact 148 are substantially the same. After forming the capacitor contact 148, the capacitor structure formed over the capacitor contact 148 may be formed in any known methods to complete the DRAM 100.

As described previously, in the present disclosure, by using the photoresist pattern 146 formed over the metal layer 144 as an etching mask to remove a portion of the hard mask layer 132, the hard mask layer 132 over the bit line 128 may have a flat top surface, and the aspect ratio of the capacitor contact 148 may be reduced. In this way, in the present disclosure, it may be easier to fill in the capacitor contact conductive layer, and the resistance uniformity of the capacitor contact 148 is favored, and the yield may be improved. Moreover, since it may be easier to control the planarization process of the capacitor contact conductive layer, it is less likely to be short-circuited between the capacitor contacts 148.

Therefore, the present disclosure provides process optimization solution to improve yield. Moreover, the present disclosure is suitable for making miniaturized DRAM, so as to increase the total number of dies on a wafer. Therefore, the production cost and energy consumption of manufacturing a single IC are reduced, and the production energy consumption of subsequent packaging is also reduced, thereby reducing carbon emissions in the process of DRAM. Accordingly, the present disclosure provides a sustainable DRAM.

Accordingly, the present disclosure may be used on automotive electronics, such as Advanced Driver Assistance Systems (ADAS), Instrument Clusters, Infotainment. The present disclosure may be used on Industrial applications, such as aerospace, medical, safety equipment, health & fitness, industrial controls, instrumentation, security, transportation, telecommunications, PoS machines, human machine interface, programmable logic controller, smart meter, and industrial networking. The present disclosure may be used on communication and networking devices such as STB, switches, routers, passive optical networks, xDSL, wireless access point, cable modem, power line communications M2M, mobile phones, base stations, DECT phones, and many other new communication products. The present disclosure may be used on desktops, notebooks, servers, gaming notebooks, ultrabooks, tablets, convertibles, HDD, and SSD. The present disclosure may be used on space constrained applications including Wearable, MP3 players, smart watches, games, digital radio, toys, cameras, digital photo album, GPS, Bluetooth and WiFi modules. The present disclosure may be used on television, display and home electronics.

What is claimed is:

1. A method for forming a Dynamic Random Access Memory (DRAM), comprising:
   forming an isolation structure surrounding an active area in a substrate;
   forming a plurality of bit line contacts over the active area;
   forming a plurality of bit lines each disposed over one of the bit line contacts;
   forming a plurality of hard mask layers over the respective bit lines;
   forming a plurality of blocking structures disposed between adjacent bit lines in an array region;
   forming a semiconductor material layer between the blocking structures;
   forming a separation material disposed in a separation trench formed in the semiconductor material layer, such that adjacent portions of the semiconductor material layer are electrically separated;
   forming a metal layer over the semiconductor material layer and the hard mask layer;
   forming a photoresist pattern over the metal layer, wherein the photoresist pattern exposes a top surface of the metal layer over the hard mask layer;
   removing the metal layer exposed by the photoresist pattern, such that a top surface of the hard mask layer is exposed by a remaining portion of the metal layer and the photoresist pattern;
   removing a portion of the hard mask layer exposed by the photoresist pattern, then removing the photoresist pattern; and
   forming a capacitor contact conductive layer over the remaining portion of the metal layer after removing the portion of the hard mask layer.

2. The method for forming a DRAM as claimed in claim 1, further comprising:
   etching back the semiconductor material layer to form a contact recess beside the bit line, wherein the remaining portion of the metal layer forms a recess, and the capacitor contact conductive layer fills up the recess.

3. The method for forming a DRAM as claimed in claim 2, wherein a top surface of the semiconductor material layer is level with a top surface of the bit line after etching back the semiconductor material layer.

4. The method for forming a DRAM as claimed in claim 2, further comprising:
   planarizing the capacitor contact conductive layer to expose a top surface of a remaining portion of the hard mask layer to form a capacitor contact in the contact recess.

5. The method for forming a DRAM as claimed in claim 4, wherein a top surface of the capacitor contact is level with a top surface of the remaining portion of the hard mask layer.

6. The method for forming a DRAM as claimed in claim 2, wherein after etching back the semiconductor material layer and before removing a portion of the hard mask layer, the hard mask layer has a curved top surface, and a top surface of a remaining portion of the hard mask layer is level with a top surface of the remaining portion of the metal layer.

7. The method for forming a DRAM as claimed in claim 4, wherein a top surface of the capacitor contact is level with the a surface of the remaining portion of the metal layer.

8. The method for forming a DRAM as claimed in claim 1, further comprising:
   forming a silicide layer over the semiconductor material layer before forming the metal layer.

9. The method for forming a DRAM as claimed in claim 1, wherein a remaining portion of the hard mask layer is 80%-95% of a thickness of the hard mask layer before etching.

10. The method for forming a DRAM as claimed in claim 1, wherein a material of the metal layer and a material of the capacitor contact conductive layer are different.

11. The method for forming a DRAM as claimed in claim 1, wherein the metal layer comprises Co, and the capacitor contact conductive layer comprises W.

12. The method for forming a DRAM as claimed in claim 1, wherein a remaining portion of the hard mask layer has a flat top surface.

13. The method for forming a DRAM as claimed in claim 1, further comprising:
   implanting the active area before removing the portion of the hard mask layer.

14. The method for forming a DRAM as claimed in claim 1, wherein the photoresist pattern covers a periphery region.

* * * * *